United States Patent
Fisk, II et al.

(10) Patent No.: US 8,952,765 B2
(45) Date of Patent: Feb. 10, 2015

(54) SYSTEM AND METHODS OF BIMODAL AUTOMATIC POWER AND FREQUENCY TUNING OF RF GENERATORS

(71) Applicant: MKS Instruments, Inc., Andover, MA (US)

(72) Inventors: Larry J. Fisk, II, Fairport, NY (US); Amish Rughoonundon, Pittsford, NY (US)

(73) Assignee: MKS Instruments, Inc., Andover, MA (US)

( * ) Notice: Subject to any disclaimer, the term of this patent is extended or adjusted under 35 U.S.C. 154(b) by 107 days.

(21) Appl. No.: 13/803,170

(22) Filed: Mar. 14, 2013

(65) Prior Publication Data
US 2014/0097908 A1   Apr. 10, 2014

Related U.S. Application Data

(60) Provisional application No. 61/615,063, filed on Mar. 23, 2012.

(51) Int. Cl.
| | |
|---|---|
| H03C 1/00 | (2006.01) |
| H03B 5/12 | (2006.01) |
| H01J 37/32 | (2006.01) |
| H03F 3/20 | (2006.01) |
| H03K 3/55 | (2006.01) |

(52) U.S. Cl.
CPC ............... *H03B 5/1237* (2013.01); *H03K 3/55* (2013.01); *H01J 37/32082* (2013.01); *H03F 3/20* (2013.01); *H01J 37/32174* (2013.01)
USPC ........... 332/149; 327/181; 438/714; 330/285; 330/296; 315/111.31

(58) Field of Classification Search
CPC ...... H03F 1/302; H03F 1/0261; H01J 37/321; H01J 2237/0206; H01J 37/02; H01J 37/32183; H03C 1/00; H01L 21/3065; H01L 21/31116; H01L 22/26; H01L 21/67115; H01L 21/67248; H01L 22/12; H05H 1/0081; H05H 1/46; H05H 2001/4682; B23K 10/003; B23K 2201/40; G01J 5/0003; H03K 3/55
USPC .......... 332/149, 106, 108, 151; 330/296, 285, 330/137; 315/111.51; 438/714
See application file for complete search history.

(56) References Cited

U.S. PATENT DOCUMENTS

| | | | |
|---|---|---|---|
| 8,314,561 B2 * | 11/2012 | Fisk et al. ................. | 315/111.21 |
| 8,736,377 B2 * | 5/2014 | Rughoonundon et al. .... | 330/296 |
| 2010/0327927 A1 | 12/2010 | Nagarkatti et al. | |
| 2013/0213573 A1 | 8/2013 | Valcore, Jr. et al. | |
| 2013/0213934 A1 | 8/2013 | Valcore, Jr. et al. | |
| 2014/0009073 A1 | 1/2014 | Valcore, Jr. et al. | |

* cited by examiner

*Primary Examiner* — Arnold Kinkead
(74) *Attorney, Agent, or Firm* — Harness, Dickey & Pierce, P.L.C.

(57) ABSTRACT

A radio frequency generator includes a power control module, a frequency control module and a pulse generating module. The power control module is configured to generate a power signal indicating power levels for target states of a power amplifier. The frequency control module is configured to generate a frequency signal indicating frequencies for the target states of the power amplifier. The pulse generating module is configured to (i) supply an output signal to the power amplifier, (ii) recall at least one of a latest power level or a latest frequency for one of the target states of the power amplifier, and (iii) adjust a current power level and a current frequency of the output signal from a first state to a second state based on the power signal, the frequency signal, and at least one of the latest power level and the latest frequency of the power amplifier.

20 Claims, 6 Drawing Sheets

SYSTEM AND METHODS OF BIMODAL AUTOMATIC POWER AND FREQUENCY TUNING OF RF GENERATORS

CROSS-REFERENCE TO RELATED APPLICATIONS

This application claims the benefit of U.S. Provisional Application No. 61/615,063, filed on Mar. 23, 2012. The entire disclosure of the above application is incorporated herein by reference.

FIELD

The present disclosure relates to radio frequency (RF) generators and, more particularly, to power and frequency tuning control of RF generators.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Plasma etching is frequently used in semiconductor fabrication. In plasma etching, ions are accelerated by an electric field to etch exposed surfaces on a substrate. The electric field is generated based on RF power signals generated by one or more radio frequency (RF) generators of a RF power system. The RF power signals generated by the RF generators must be precisely controlled to effectively execute plasma etching.

A RF power system may include a RF generator, a matching network, and a load, such as a plasma chamber. The RF power signals may be used to drive the load to fabricate various components such as integrated circuits, solar panels, compact disks (CDs), digital versatile (or video) discs (DVDs), and the like. The load may include any of a number of elements or devices driven by a RF signal, including, by way of a non-limiting example, a plasma chamber. The load may include broadband mismatched loads (i.e. cables with mismatched resistor terminations), narrowband mismatched loads (i.e. a 2-element matching network) and resonator loads.

The RF power signals are received at the matching network. The matching network matches an input impedance of the matching network to a characteristic impedance of a transmission line between the RF generator and the matching network. This impedance matching aids in minimizing an amount of power applied to the matching network in a forward direction toward the plasma chamber ("forward power") and reflected back from the matching network to the RF generator ("reverse power"). Impedance matching also assists in maximizing forward power output from the matching network to the plasma chamber.

In the RF power supply field, there are typically two approaches to applying the RF signal to the load. A first, more traditional approach is to apply a continuous wave signal to the load. The continuous wave signal is typically a sinusoidal wave that is output continuously by the power supply to the load. In the continuous wave approach, the RF signal assumes a sinusoidal output, and the amplitude and/or frequency of the sinusoidal wave can be varied in order to vary the output power applied to the load. A second approach to applying the RF signal to the load involves pulsing the RF signal, rather than applying a continuous wave signal to the load.

SUMMARY

A radio frequency generator is provided and includes a power control module, a frequency control module and a pulse generating module. The power control module is configured to generate a power signal indicating power levels for target states of a power amplifier. The frequency control module is configured to generate a frequency signal indicating frequencies for the target states of the power amplifier. The pulse generating module is configured to (i) supply an output signal to the power amplifier, (ii) recall at least one of a latest power level or a latest frequency for one of the target states of the power amplifier, and (iii) adjust a current power level and a current frequency of the output signal from a first state to a second state based on the power signal, the frequency signal, and at least one of the latest power level and the latest frequency of the power amplifier.

In other features, a method is provided and includes generating a power signal indicating power levels for target states of a power amplifier in a radio frequency generator. A frequency signal is generated indicating frequencies for the target states of the power amplifier. An output signal is supplied to the power amplifier. At least one of a latest power level and a latest frequency is recalled for one of the target states of the power amplifier. A current power level and a current frequency of the output signal are adjusted from a first state to a second state based on the power signal, the frequency signal, and at least one of the latest power level and the latest frequency of the power amplifier.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

In the drawings, reference numbers may be reused to identify similar and/or identical elements.

DESCRIPTION

Power out ("output power") of a RF generator may be pulsed and include, for example, a HIGH state and a LOW state. The HIGH state may refer to a peak power level (or amplitude) of a pulse. The LOW state may refer to a minimum power level of a pulse and/or a power level between consecutive pulses. Although this example provides two states (HIGH and LOW), the output power of an RF generator may have n different states, where n is an integer greater than or equal to two. The pulses of the output power may be RF frequency tuned for low frequency changes (frequency changes less than a predetermined frequency) in output power and/or load impedances. As the RF frequency at which the output power and/or load impedance changes increase, the ability to tune the RF frequency of the output power such that impedance matching occurs is limited.

As a result, for changes in output power and load impedance occurring at a high frequency, a first (or HIGH) state of the output power may be frequency tuned over multiple pulses to a predetermined frequency. Once the RF frequency of the first state matches the predetermined frequency, the RF frequency of the output power may not be changed. This causes the RF frequency for all states to be the same. As a result, impedance matching is good for the first state and may be off (not as accurate) for the other states. An alternative to this is not to perform RF frequency tuning, which results in all states potentially having off impedance matching.

RF frequency tuning can be slow and may not achieve a target before a next pulse change. This can limit either the impedance match or the pulse rate. The following implementations include RF generators that control discrete states of output power. Power and RF frequency of the output power are controlled to transition between the discrete states in a step-wise fashion (i.e., based respective power setpoints and RF frequency setpoints). This control is provided based on feedback of latest previously delivered power levels and corresponding RF frequencies. This feedback control allows for quick changes in RF frequency and power levels of the output power providing quick response times to changes in power setpoint and/or load impedance. During pulsing, the implementations disclosed herein (i) minimize reflected power for multiple different power levels, (ii) minimize reflected power for changes in a load, and (iii) increase control over delivered output power. The changes in the load may be due to, for example, pulsed plasma of the load.

Figure 1:
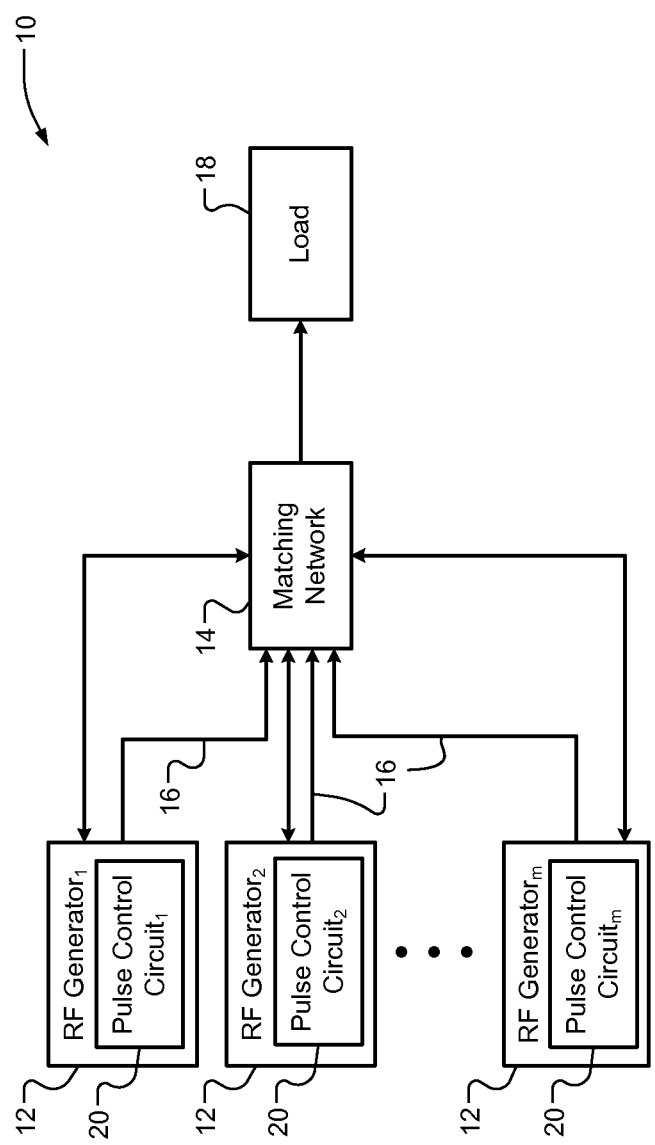
FIG. 1 is a functional block diagram of a RF power system in accordance with the present disclosure.

FIG. 1 shows a RF power system 10. The RF power system 10 may include one or more RF generators 12 (RF generators$_{1-m}$ are shown). The RF generators 12 may receive alternating current (AC) power and provide RF power to a matching network 14 via respective transmission lines 16, which in turn provide RF power to a load 18. For example only, the AC power may be three-phase AC power of approximately 480 Volts AC (VAC) or another suitable voltage. Power out of the RF generators 12 may be combined in the matching network 14 and provided to the load 18. As an alternative, a matching network may be provided for each of the RF generators 12 and outputs of the matching networks may be combined and provided to the load 18.

The RF generators 12 include respective pulse control circuits 20 (pulse control circuits$_{1-m}$ are shown). The pulse control circuits 20 provide output power, which is transmitted on the transmission lines 16 to the matching network 14. The output power provided by each of the RF generators 12 may be continuous wave (CW) power, pulsed power, or pseudo-CW power. CW power may be in the form of, for example, a sinusoidal signal. Pulsed power may include discrete pulses having different RF frequencies and/or power levels and a corresponding pulsing frequency (or frequency at which the pulsed power changes between states). Pseudo-CW power may include discrete pulses, where each pulse has a same power level.

Although power setpoints of an RF generator may be the same while in a pseudo-CW mode, RF frequencies may be different and/or modulated to have the same pulsing frequencies of other RF generators. As an example, one or more of the RF generators 12 may provide a pulsed output power signal with changing amplitude and RF frequency (referred to operating in a bimodal mode). One or more of the other RF generators 12 may provide a pseudo-CW power signal having the same pulsing frequency as frequency of the pulsed output power signal (referred to as operating in a pseudo-CW mode). This allows the pulsing frequency of the pseudo-CW power signal to match the pulsed frequency of the pulsed output power signal at any moment in time. Each of the RF generators 12 operating in the bimodal mode and/or the pseudo-CW mode may generate RF output signals based on the same or different predetermined states and/or detected RF outputs of respective power amplifiers in the RF generators 12.

The matching network 14 matches an input impedance of the matching network 14 to characteristic impedances of the transmission lines 16. Put another way, the matching network 14 matches an impedance of the load 18 to impedances as seen by outputs of the RF generators 12. The matching network 14 and the load 18 may be considered as the load on the RF generators 12. The load 18 may be, for example, a plasma chamber or other RF load. The impedance of the load 18 may be static (i.e. unchanging over time) or dynamic (i.e. changing over time).

Although each of the RF generators 12 are shown as having a single RF output, each of the RF generators 12 may have any number of RF outputs. For example only, the RF generators 12 may generate a RF output per plasma electrode implemented in one or more plasma chambers of the load 18. One or more of the RF generators 12 may control the matching network 14. More specifically, the RF generators 12 may control the extent to which the matching network 14 performs impedance matching. The matching network 14 may apply the RF outputs to plasma electrodes, respectively, implemented within the load 18. Application of the RF outputs to the plasma electrodes may be performed, for example, in thin film deposition systems, thin film etching systems, and in other suitable systems. The RF outputs may also be applied to other suitable systems.

Figure 2:
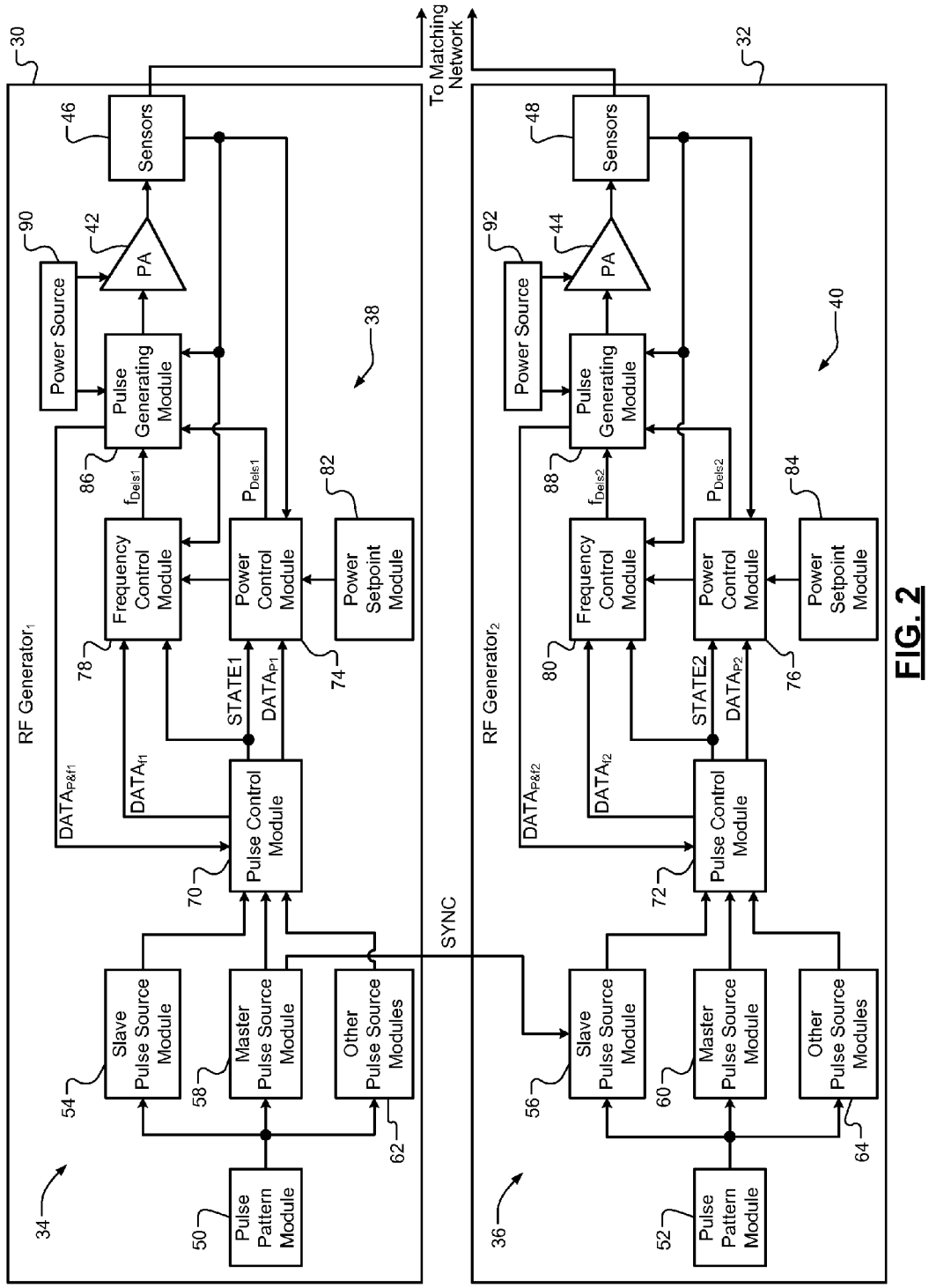
FIG. 2 is a functional block diagram of RF generators in accordance with the present disclosure.

Referring now to FIG. 2, which shows RF generators 30, 32 (may be referred to as RF generator modules). The RF generators 30, 32 may replace two of the RF generators 12 of FIG. 1. The RF generators 30, 32 provide RF output power, which may be provided to a matching network (e.g., the matching network 14). The RF generators 30, 32 may include respective source circuits 34, 36, pulse control circuits 38, 40, power amplifiers 42, 44 and sensors 46, 48. The source circuits 34, 36 generate pulse patterns, which are provided to the pulse control circuits 38, 40. The pulse control circuits 38, 40 control RF and pulsing frequencies and power levels of RF outputs provided by the pulse control circuits 38, 40 and/or power amplifiers 42, 44. The sensors 46, 48 detect and/or are used to detect RF frequencies and RF outputs of the power amplifiers 42, 44.

The source circuits 34, 36 may include pulse pattern modules 50, 52, slave pulse source modules 54, 56, master pulse source modules 58, 60, and other pulse source modules 62, 64. The pulse pattern modules 50, 52 may determine pulse patterns including pulse magnitudes, pulse times, power levels, pulse widths (or durations), delays between pulses, duty cycles of the pulse patterns, RF frequencies, etc. The pulse patterns may be generated based on stored values for each of these parameters. The pulse patterns and/or any of these parameters may be provided to one or more of the pulse source modules 54-64. The pulse patterns indicate when to transition from a current state to a next state. Each of the states may have a respective magnitude, duration, RF frequency, and power level.

The pulse source modules 54-64 generate pulse patterns for the pulse control circuits 38, 40 based on the outputs of the pulse pattern modules 50, 52. The pulse source modules 54-64 may generate the pulse patterns based on synchronization signals, and/or detected RF outputs of the pulse control circuits 38, 40 and/or the power amplifiers 42, 44. As an example, the first RF generator 30 may operate as a master while the second RF generator 32 may operate as a slave. In this example, the slave pulse source module 56 of the second RF generator 32 may receive a synchronization signal from the master pulse source of the first RF generator, as shown. The synchronization signal may indicate power levels of a pulse pattern generated by the master pulse source module 58 of the first RF generator 30 and not pulse durations. The slave pulse source module 56 of the second RF generator 32 may then generate a pulse pattern based on the synchronization signal and an output of the pulse pattern module 52 of the second RF generator 32. The other pulse source modules 62, 64 may generate pulse patterns based on synchronization signals and/or detected RF outputs of the pulse control circuits 38, 40 and/or power amplifiers 42, 44.

The pulse control circuits 38, 40 include respective pulse control modules 70, 72, power control modules 74, 76, frequency control modules 78, 80, power setpoint modules 82, 84, and pulse generating modules 86, 88. The pulse control modules 70, 72 receive respective (i) pulse pattern signals from outputs of the pulse source modules 54-64, and (ii) feedback data signals $DATA_{P\&f1}$, $DATA_{P\&f2}$. Each of the feedback data signals $DATA_{P\&f1}$, $DATA_{P\&f2}$ include one or more updated power levels and one or more updated RF frequencies of RF outputs of the respective power amplifiers 42, 44.

The pulse control modules 70, 72 determine pulsing frequencies and generate state signals STATE1, STATE2, power data signals $DATA_{P1}$, $DATA_{P2}$ and frequency data signals $DATA_{f1}$, $DATA_{f2}$ based on the pulse pattern signals and the feedback data signals $DATA_{P\&f1}$, $DATA_{P\&f2}$. The pulsing frequencies (e.g., 10-100 kHz) may be stored in the pulse control modules 70, 72, memory of the RF power generators 30, 32, and or received as inputs from an input device (e.g., user interface). The pulsing frequencies may be used to modulate RF output power of the RF generators 30, 32, which have respective RF frequencies (e.g., 10-20 MHz). The pulsing frequencies refer to rates at which the RF output power is changed between states. RF frequencies of the RF output power is a function of the corresponding pulsing frequencies.

The state signals STATE1, STATE2 indicate a next state, for example, via a numerical value. The state signals STATE1, STATE2 may be an integer greater than or equal to zero. In one implementation, the state signals STATE1, STATE2 provide state values i, where i is equal to 0-n and n is a total number of states. The power data signals $DATA_{P1}$, $DATA_{P2}$ may indicate the one or more updated power levels. The frequency data signals $DATA_{f1}$, $DATA_{f2}$ may indicate the updated RF frequencies of the respective RF outputs of the power amplifiers 42, 44.

The power control modules 74, 76 generate power control signals $P_{Dels1}$, $P_{Dels2}$, which indicate power levels for each of the n states. The power control modules 74, 76 generate outputs indicative of predetermined amplitudes of the RF outputs of the power amplifiers 42, 44 for each of the n states. The outputs of the power control modules 74, 76 are also indicative of when to transition between the states. The power control modules 74, 76 receive the state signals STATE1,
STATE2 the power data signals $DATA_{P1}$, $DATA_{P2}$, and setpoint signals SET1, SET2. The setpoint signals SET1, SET2 are received from the power setpoint modules 82, 84 and are indicative of predetermined power setpoints (e.g., $P_{Del(i)}$) for each of the power control modules 74, 76. For example only, the power setpoint modules 82, 84 may store the predetermined power setpoints $P_{Del(i)}$. The power control signals $P_{Dels1}$, $P_{Dels2}$ may also include step sizes corresponding to incremental offsets between intermediate setpoints when transitioning between current states and target states. The step sizes may refer to amplitudes and/or durations of transition pulses between current pulses and target pulses of the pulse generating modules 86, 88 and/or the power amplifiers 42, 44. This allows the power levels of the power amplifiers 42, 44 to be tuned over time to target power levels for target states of the pulse generating modules 86, 88 and/or the power amplifiers 42, 44. The power control modules 74, 76 generate the power control signals $P_{Dels1}$, $P_{Dels2}$ based on the state signals STATE1, STATE2, the power data signals $DATA_{P1}$, $DATA_{P2}$ and the predetermined power setpoints.

The frequency control modules 78, 80 generate frequency control signals $f_{Dels1}$, $f_{Dels2}$ which include RF frequency setpoints $f_{(0)}$-$f_{(n)}$ for each of the n states based on the state signals STATE1, STATE2 and frequency data signals $DATA_{f1}$, $DATA_{f2}$. The frequency control modules 78, 80 store the RF frequency setpoints $f_{(0)}$-$f_{(n)}$, which correspond to the power setpoints. The frequency control signal may also include step sizes corresponding to incremental offsets between intermediate setpoints when transitioning between current states and target states. The step sizes of the frequency control signal may refer to changes in RF frequency to provide each transition pulse between current pulses and target pulses of the pulse generating modules 86, 88 and/or the power amplifiers 42, 44. This allows the RF frequencies of power out of the power amplifiers 42, 44 to be tuned over time to target RF frequencies for target states of the pulse generating modules 86, 88 and/or the power amplifiers 42, 44. The power control modules 74, 76 and/or the frequency control modules 80, 82 may each include a proportional integral derivative (PID) controller and/or a direct digital synthesis (DDS) component(s).

The pulse generating modules 86, 88 generate the RF outputs having predetermined pulses based on the outputs of the pulse control modules 70, 72, the power control modules 74, 76, and the frequency control modules 78, 80. The pulse generating modules 86, 88 and the power amplifiers 42, 44 may receive power from respective power sources 90, 92. Although the power sources 90, 92 are shown as part of the RF generators 30, 32, the power sources 90, 92 may be external to the RF generators 30, 32 and be integrated into a single power source. The power sources 90, 92 may be, for example, a direct current (DC) power sources. The power sources 90, 92 may receive AC input power and generate DC power for the pulse generating modules 86, 88 and/or the power amplifiers 42, 44. The power amplifiers 42, 44 amplify the RF outputs of the pulse generating modules 86, 88.

The pulse generating modules 86, 88 store updated power levels and RF frequencies of the RF outputs of the power amplifiers 42, 44. The power levels may be detected by the sensors 46, 48 and/or determined based on outputs of the sensors 46, 48 and fed back to the pulse generating modules 86, 88. The RF frequencies may be determined by the frequency control modules 78, 80. The RF frequencies may be determined based on multiple inputs. A first input may include identifications of current states (also referred to as pulse states) as determined by and received from the pulse control modules 70, 72. Other inputs may be outputs of the sensors 46, 48. The frequency control modules can recall latest frequencies for each state. The frequency control module may then select RF frequencies to minimize reflected power (or reflection ratio γ) for each state.

Storing and recalling the updated power levels and RF frequencies allows for quick transitions between states. The pulse generating modules 86, 88 may generate the feedback data signals $DATA_{P\&f1}$, $DATA_{P\&f2}$ and/or the RF outputs of the pulse generating modules 86, 88 based on the power control signals $P_{Dels1}$, $P_{Dels2}$ and the frequency control signals $f_{Dels1}$, $f_{Dels2}$. The updated power levels and RF frequencies are indicated in the feedback data signals $DATA_{P\&f1}$, $DATA_{P\&f2}$.

Multiple feedback loops are provided. First feedback loops include detection of the updated power levels and RF frequencies, which are fed back to the pulse generating modules 86, 88. Second feedback loops include providing the updated power levels and RF frequencies from the pulse generating modules 86, 88 to the pulse control modules 70, 72. Third feedback loops include providing sensor signals and/or detected parameters from the sensors 46, 48 to the power setpoint modules 82, 84. The power setpoint modules 82, 84 may determine the power setpoints based on the sensor signals and/or detected parameters. Fourth feedback loops may include providing sensor signals and/or detected parameters from the sensors 46, 48 to the frequency control modules 78, 80. The frequency control modules 78, 80 may determine the RF frequency setpoints based on the sensor signals and/or detected parameters.

The sensors 46, 48 may include voltage, current and/or directional coupler sensors. The sensors 46, 48 may detect (i) voltages and currents out of the power amplifiers 42, 44, (ii) forward (or source) power out of the power amplifiers 20 and/or RF generators 30, 32, and (iii) reverse (or reflected) power received from the matching network. The voltages, currents, forward power, and reverse power may be scaled and/or filtered versions of the actual voltages, currents, forward power and reverse power of the RF outputs of the power amplifiers 42, 44. The sensors 46, 48 may be analog and/or digital sensors. In a digital implementation, the sensors 46, 48 may include analog-to-digital (A/D) converters and signal sampling components with corresponding sampling rates. The sensors 46, 48 generate sensor signals, which are received by the power control modules 74, 76, the frequency control modules 78, 80 and/or the pulse generating modules 86, 88. The sensor signals may indicate the voltages, currents, forward power and reverse power.

Figure 3:
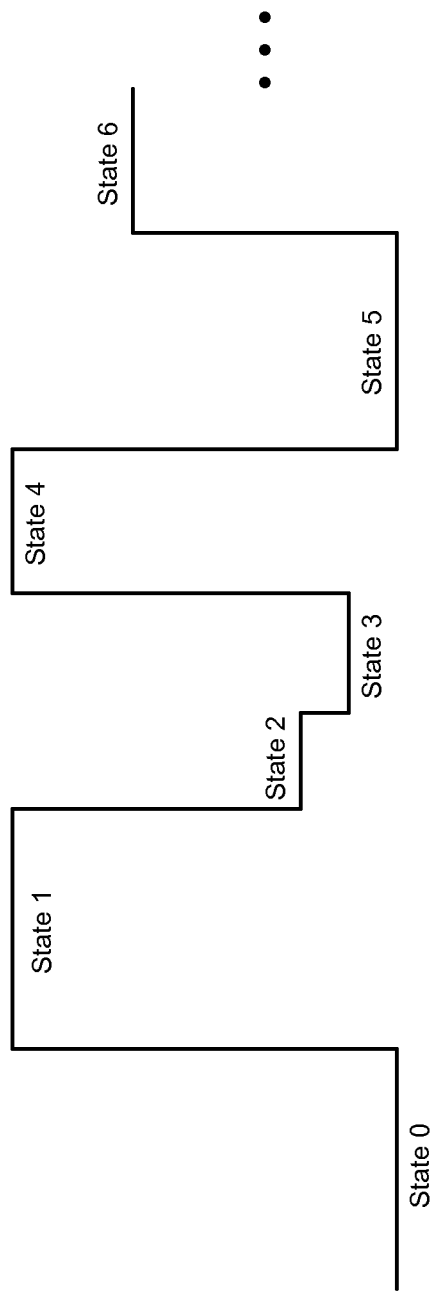
FIG. 3 is a power signal diagram illustrating states of output power of a pulse generating module, a power amplifier, or a RF generator in accordance with the present disclosure.

FIG. 3 shows a power signal diagram illustrating pulses and corresponding states of output power of a pulse generating module, a power amplifier and/or a RF generator (e.g., one of the pulse generating modules 86, 88, power amplifiers 42, 44 and/or RF generator 12, 30, 32 of FIGS. 1, 2). The pulse generating module, the power amplifier and/or the RF generator may generate outputs having n discrete states. Each of the n discrete states has an associated RF frequency, duration, amplitude, and duty cycle. In FIG. 3, example States 0-6 are shown. The States 0-6 illustrate different pulse widths (or durations), amplitudes, duty cycles, RF frequencies, etc. The states of output power may include multiple amplitudes per pulse and/or state.

As an example, the pulse generating module, the power amplifier, or the RF generator may transition from a current state (State 0) to a target state (one of States 1-6 or other target state). States 1-6 may be transition states (or intermediate states). The pulse generating module, the power amplifier, or the RF generator may transition from a current state to a target state over one or more pulses. When transition states are included, predetermined offsets may be used to transition to and from the transition states. The offsets may indicate changes in amplitude (or power level), RF frequency, pulse duration, etc. The offsets may be stored in, provided to and/or used by a pulse control module, a power control module, a frequency control module, and/or a pulse generating module (e.g., one or more of modules 70-88 of FIG. 2) of the RF generator. Each of these modules may have respective offset values.

For example, the pulse generating module may pulse between power setpoints, (e.g., two or more of power setpoints $P_{De1(0)}$-$P_{Del(n)}$) for a transition from the first state to the second state. Similarly, the pulse generating module maintains a different RF power setpoint for each of multiple RF frequency setpoints $f_{(0)}$-$f_{(n)}$. When a pulse change occurs, both the RF power and RF frequency may be gradually changed between the range of power and RF frequency setpoints over a first period.

Figure 4:
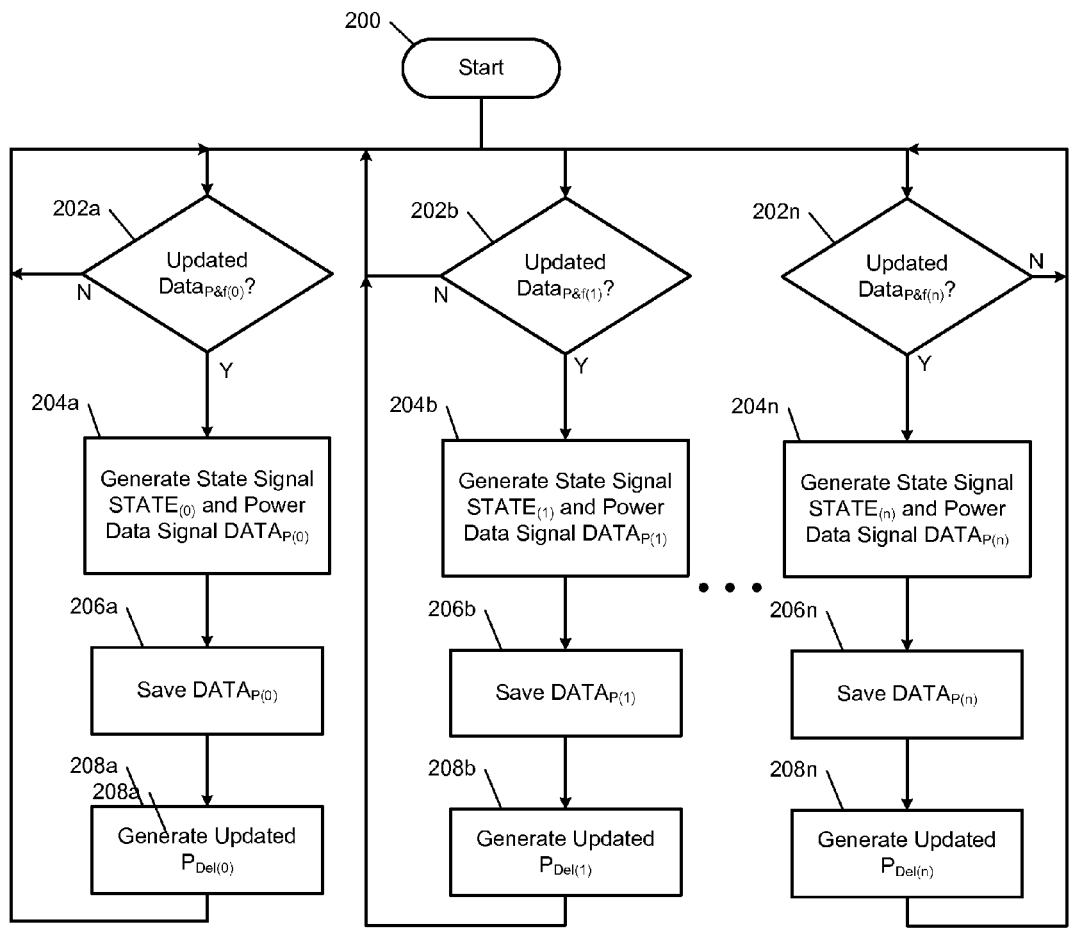
FIG. 4 illustrates a power control method in accordance with the present disclosure.

FIG. 4 illustrates a power control method. The power control method may be performed by, for example, one or more of the pulse control modules 70, 72 and/or power control modules 74, 76 of FIG. 2. Although the following tasks are primarily described with respect to the implementations of FIGS. 1-2 and the features of a single RF generator, the tasks may be easily modified to apply to other implementations of the present disclosure and to multiple RF generators. The tasks may be iteratively performed. The method of FIG. 4 may begin at 200. In this method parallel sets of tasks are performed. Each set of tasks corresponds with one of n states. Although the sets of tasks are shown as being performed in parallel, during a same period and/or simultaneously, the sets of tasks may be performed sequentially and/or in a different order.

At 202a-n, the pulse control module 70 and/or the power control module 74 determines whether updated power levels and/or RF frequencies have been detected and saved. The updated power levels may have been detected by the sensors 46 and stored in and/or accessed by the pulse generating module 86, the pulse control module 70 and/or the power control module 74. The updated RF frequencies may have been determined by the frequency control module 78 as described above and stored in and/or accessed by the pulse generating module 86, the pulse control module 70 and/or the power control module 74. The updated power levels and/or RF frequencies may be indicated via the feedback data signal $DATA_{P\&f1}$. If updated power levels have been detected and stored, tasks 204a-n are performed.

At 204a-n, the pulse control module 70 may generate the state signal STATE1 and the power data signal $DATA_{P1}$ based on the updated power levels and RF frequencies and one or more outputs of one or more pulse source modules (e.g., one or more of the pulse source modules 54, 58, 62).

At 206a-n, the power control module 74 may save and/or transfer the updated power level data to the frequency control module 78. Tasks 206a-n may not be performed when this data is provided from the pulse control module 70 and/or the pulse generating module 86 to the frequency control module 78.

At 208a-n, the power control module 74 generates power control signal $P_{Dels1}$ to include one or more power levels for each of the n states. The power control module 74 generates the power control signal $P_{Dels1}$ based on the state signal STATE1 and the updated power data. The method may end subsequent to tasks 208a-n or may return to tasks 202a-n, as shown.

Figure 5:
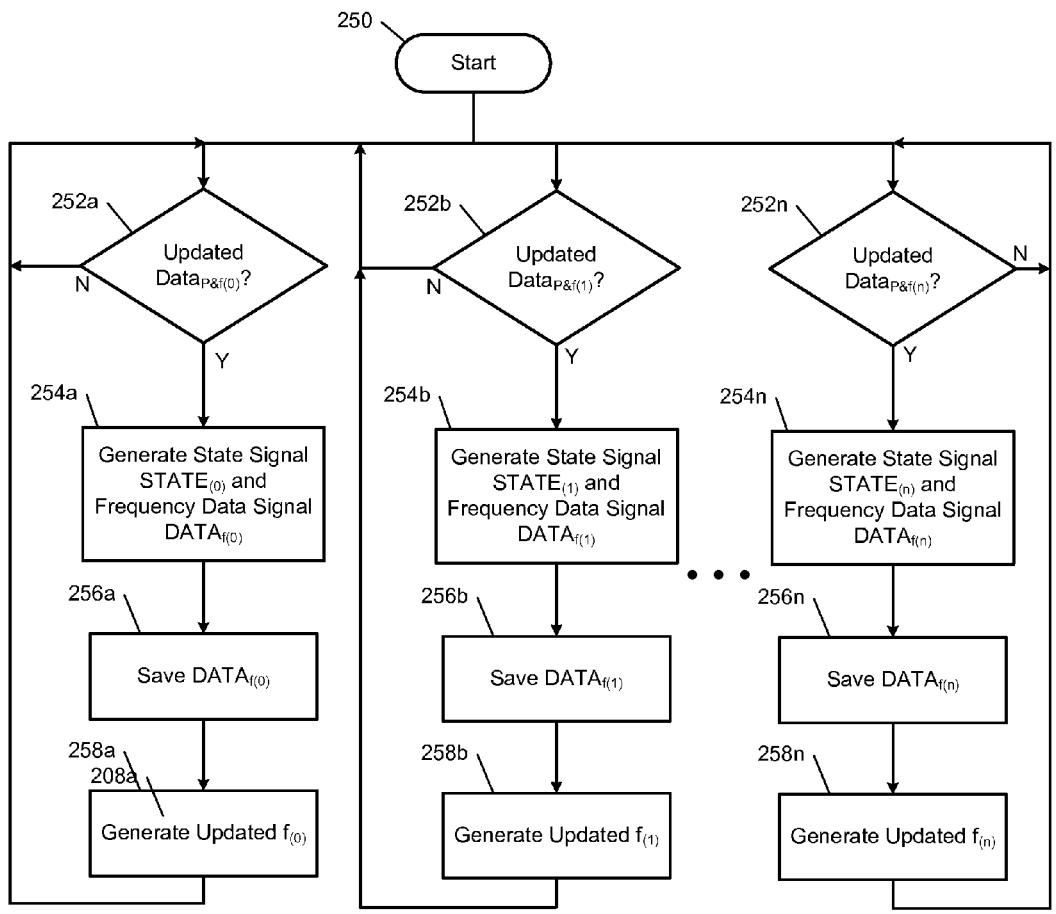
FIG. 5 illustrates a frequency control method in accordance with the present disclosure.

FIG. 5 illustrates a frequency control method. The frequency control method may be performed by, for example, one or more of the pulse control modules 70, 72 and/or the frequency control modules 78, 80 of FIG. 2. Although the following tasks are primarily described with respect to the implementations of FIGS. 1-2 and the features of a single RF generator, the tasks may be easily modified to apply to other implementations of the present disclosure and to multiple RF generators. The tasks may be iteratively performed. The method of FIG. 5 may begin at 250.

At 252a-n, the pulse control module 70 and/or the frequency control module 78 determines whether updated power levels and/or RF frequencies have been detected and saved. The updated power levels may have been detected by the sensors 46 and stored in and/or accessed by the pulse generating module 86, the pulse control module 70 and/or the frequency control module 78. The updated RF frequencies may have been determined by the frequency control module 78 as described above and stored in and/or accessed by the pulse generating module 86, the pulse control module 70 and/or the power control module 74. The updated power levels and/or RF frequencies may be indicated via the feedback data signal $DATA_{P\&f1}$. If updated power levels have been detected and stored, tasks 254a-n are performed.

At 254a-n, the pulse control module 70 may generate the state signal STATE1 and the frequency data signals $DATA_{f1}$ based on the updated power levels and RF frequencies and one or more outputs of one or more pulse source modules (e.g., one or more of the pulse source modules 54, 58, 62).

At 256a-n, the frequency control module 78 may save and/or transfer the updated frequency data to the power control module 74. Tasks 256a-n may not be performed when this data is provided from the pulse control module 70 and/or the pulse generating module 86 to the power control module 74.

At 258a-n, the frequency control module 78 generates frequency control signal $f_{Dels1}$ to include a RF frequency for each of n states. The frequency control module 78 generates the frequency control signal $P_{Dels1}$ based on the state signal STATE1 and the updated frequency data. The method may end subsequent to tasks 258a-n or may return to tasks 252a-n, as shown.

Figure 6:
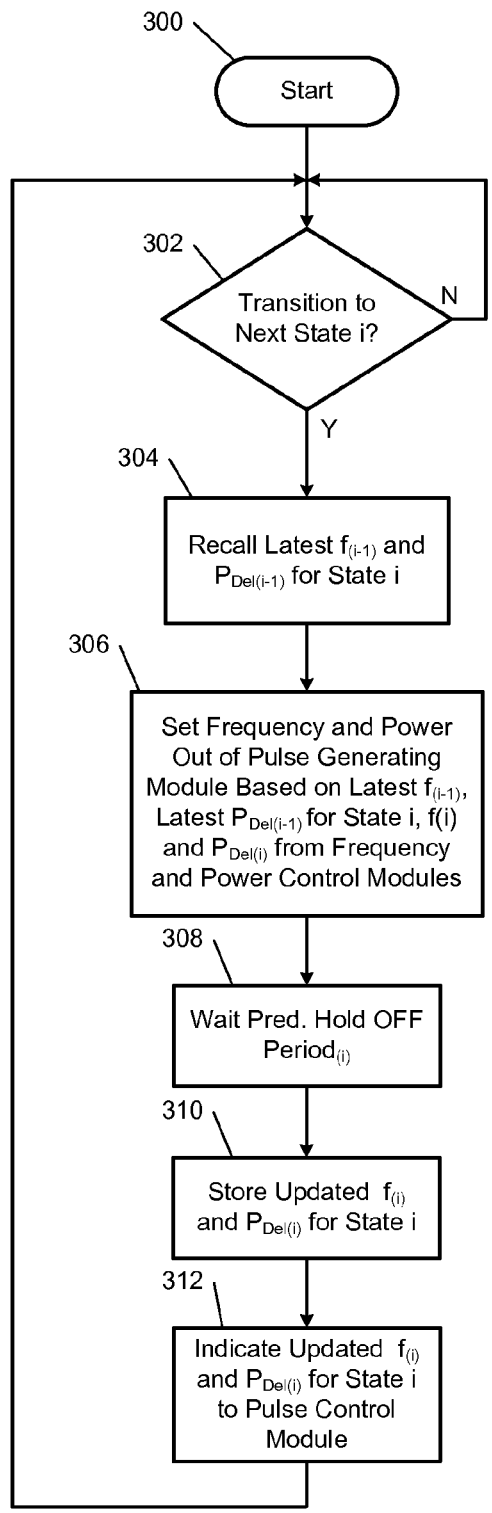
FIG. 6 illustrates a state control method of a pulse generating module and in accordance with the present disclosure.

FIG. 6 illustrates a state control method. The state control method may be performed by, for example, one or more of the pulse generating modules 86, 88 of FIG. 2. Although the following tasks are primarily described with respect to the implementations of FIGS. 1-2 and the features of a single RF generator, the tasks may be easily modified to apply to other implementations of the present disclosure and to multiple RF generators. The tasks may be iteratively performed. The method of FIG. 6 may begin at 300.

At 302, the pulse control module 70 may determine whether to switch from a current state i−1 to a next state i. Task 304 may be performed if a transition is to be performed between states.

At 304, the pulse control module 70, the power control module 74, the frequency control module 78 and/or the pulse generating module 86 recalls the latest RF frequency f(i−1) and the latest power level $P_{Del(i-1)}$ for the state i. This information may be shared between the modules 70, 74, 78, 86. The recall and use of the latest RF frequency $f_{(i-1)}$ and the latest power level $P_{Del(i-1)}$ provides quick response times for the output of the pulse generating module 86 and/or power amplifier 42 to changes in power setpoint changes and/or load impedance changes.

At 306, the power control module 74, the frequency control module 78 and/or the pulse generating module 86 operate to set the power level and RF frequency of an RF output of the pulse generating module 86 to transition to and/or be set at a power level and a RF frequency indicated by the power control signal $P_{Dels1}$ and the frequency control signal $F_{Dels1}$.

This may be an incremental change in a series of incremental changes towards a target power level and a target RF frequency. The power level and the RF frequency of the pulse generating module 86 may be changed by predetermined amounts from the latest power level and RF frequency based on respective and predetermined offset values.

At 308, the pulse generating module 86 waits a predetermined hold OFF period. This allows results of the changes made during task 306 to occur and be detected by the sensors and/or one or more of the modules 70, 78, 84, 86. At 310, the pulse generating module 86 may receive and/or store an updated power level $P_{Del(i)}$ and RF frequency $F_{(i)}$ for the current state detected and/or determined by the sensors 46 and the frequency control module 78.

At 312, the pulse generating module 86 may transmit the updated power level $P_{Del(i)}$ and updated RF frequency $F_{(i)}$ in the feedback data signal $DATA_{P\&f1}$ for the current state to the pulse control module 70. The updated power level $P_{Del(i)}$ and updated RF frequency $F_{(i)}$ may be forwarded to the power control module 74 and the frequency control module 78 via the feedback data signals $DATA_{P1}$, $DATA_{f1}$. Task 302 may be performed subsequent to task 312.

The above-described tasks of FIGS. 4-6 are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

The implementations disclosed herein include an RF generator that pulses between delivered power setpoints, for example between $P_{Del}$ (High) and $P_{Del}$ (Low), the RF generator can maintain different RF frequencies for each of multiple setpoints (e.g., f(high) and f(Low)). When a pulse change occurs, both RF power and RF frequency of the RF generator may be changed during the same period and/or simultaneously. This allows the impedance match for each setpoint to be maximized. The implementations provide both high side (peak amplitude) and low side (minimum amplitude) pulse impedance matching. The implementations also maintain constant delivered power to a plasma load while pulsing various aspects of the plasma load.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

Although the terms first, second, third, etc. may be used herein to describe various elements, components, loops, circuits, and/or modules, these elements, components, loops, circuits, and/or modules should not be limited by these terms. These terms may be only used to distinguish one element, component, loop, circuit or module from another element, component, loop, circuit or module. Terms such as "first," "second," and other numerical terms when used herein do not imply a sequence or order unless clearly indicated by the context. Thus, a first element, component, loop, circuit or module discussed herein could be termed a second element, component, loop, circuit or module without departing from the teachings of the example implementations disclosed herein.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A radio frequency generator comprising:
a power control module configured to generate a power signal indicating power levels for a plurality of target states of a power amplifier;
a frequency control module configured to generate a frequency signal indicating frequencies for the plurality of target states of the power amplifier; and
a pulse generating module configured to (i) supply an output signal to the power amplifier, (ii) recall at least one of a latest power level and a latest frequency for one of the plurality of target states of the power amplifier, and (iii) adjust a current power level and a current frequency of the output signal from a first state to a second state based on the power signal, the frequency signal, and at least one of the latest power level and the latest frequency of the power amplifier.

2. The radio frequency generator of claim 1, wherein the pulse generating module is configured to (i) recall both the latest power level and the latest frequency, and (ii) adjust the output signal based on both the latest power level and the latest frequency.

3. The radio frequency generator of claim 1, wherein:
the pulse generating module is configured to provide (i) the power control module with the latest power level, and (ii) the frequency control module with the latest frequency;
the power control module is configured to generate the power signal based on the latest power level; and
the frequency control module is configured to generate the frequency signal based on the latest frequency.

4. The radio frequency generator of claim 1, wherein the pulse generating module is configured to adjust both the current power level and the current frequency during a single pulse of the power amplifier and based on the power signal, the frequency signal, the latest power level and the latest frequency.

5. The radio frequency generator of claim 1, wherein the pulse generating module is configured to adjust power levels and frequencies of each of consecutive pulses of the power amplifier based on the power signal, the frequency signal, the latest power level and the latest frequency.

6. The radio frequency generator of claim 1, wherein:
the pulse generating module configured to (i) wait a predetermined period after adjusting the current power level and the current frequency, (ii) in response to the predetermined period expiring, store an updated power level and an updated frequency of the power amplifier, and (iii) provide the updated power level to the power control module and the updated frequency to the frequency control module;
the power control module is configured to generate the power signal based on the updated power level; and
the frequency control module is configured to generate the frequency signal based on the updated frequency.

7. The radio frequency generator of claim 1, wherein the power generating module is configured to store updated power levels and updated frequencies for each of the plurality of target states.

8. The radio frequency generator of claim 1, further comprising the power amplifier and sensors, wherein:
the power amplifier is configured to receive the output signal;
the sensors are configured to detect power levels of power out of the power amplifier for each of the plurality of target states;
the frequency control module is configured to determines frequencies of the power out of the power amplifier based on indications of current pulse states, and
the power generating module is configured to store the detected power levels and frequencies as latest power levels and frequencies for the plurality of target states.

9. The radio frequency generator of claim 8, wherein:
the detect power levels and frequencies of the power out of the power amplifier are based on changes in impedance of a load of the power amplifier;
the power control module is configured to generate the power signal based on the detected power levels; and
the frequency control module is configured to generate the frequency signal based on the detected frequencies.

10. The radio frequency generator of claim 1, wherein, while the output signal is being transitioned from the first state to the second state:
the power control module is configured to incrementally adjust the power signal to adjust the current power level to a target power level for the second state; or
the pulse generating module incrementally adjusts the current power level to a target power level for the second state.

11. The radio frequency generator of claim 1, wherein, while the output signal is being transitioned from the first state to the second state:
  the frequency control module is configured to incrementally adjust the frequency signal to adjust the current frequency to a target frequency for the second state; or
  the pulse generating module incrementally adjusts the target frequency to the target frequency for the second state.

12. A method comprising:
  generating a power signal indicating power levels for a plurality of target states of a power amplifier in a radio frequency generator;
  generating a frequency signal indicating frequencies for the plurality of target states of the power amplifier;
  supplying an output signal to the power amplifier;
  recalling at least one of a latest power level and a latest frequency for one of the plurality of target states of the power amplifier; and
  adjusting a current power level and a current frequency of the output signal from a first state to a second state based on the power signal, the frequency signal, and at least one of the latest power level and the latest frequency of the power amplifier.

13. The method of claim 12, further comprising:
  recalling both the latest power level and the latest frequency; and
  adjusting the output signal based on both the latest power level and the latest frequency.

14. The method of claim 12, further comprising providing (i) a power control module with the latest power level, and (ii) a frequency control module with the latest frequency, wherein:
  the power control module is configured to generate the power signal based on the latest power level; and
  the frequency control module is configured to generate the frequency signal based on the latest frequency.

15. The method of claim 12, further comprising adjusting both the current power level and the current frequency during a single pulse of the power amplifier and based on the power signal, the frequency signal, the latest power level and the latest frequency.

16. The method of claim 12, further comprising adjusting power levels and frequencies of each of consecutive pulses of the power amplifier based on the power signal, the frequency signal, the latest power level and the latest frequency.

17. The method of claim 12, further comprising:
  waiting a predetermined period after adjusting the current power level and the current frequency;
  in response to the predetermined period expiring, storing an updated power level and an updated frequency of the power amplifier;
  generating the power signal based on the updated power level; and
  generating the frequency signal based on the updated frequency.

18. The method of claim 12, further comprising storing updated power levels and updated frequencies for each of the plurality of target states.

19. The method of claim 12, further comprising:
  receiving the output signal via the power amplifier;
  via sensors, detecting power levels of power out of the power amplifier for each of the plurality of target states, wherein the detect power levels of the power out of the power amplifier are based on changes in impedance of a load of the power amplifier;
  determining frequencies of the power out of the power amplifier based on indications of current pulse states;
  storing the detected power levels and frequencies as latest power levels and frequencies for the plurality of target states;
  generating the power signal based on the detected power levels; and
  generating the frequency signal based on the detected frequencies.

20. The method of claim 12, wherein while the output signal is being transitioned from the first state to the second state:
  incrementally adjusting the power signal to adjust the current power level to a target power level for the second state;
  incrementally adjusting the current power level to a target power level for the second state;
  incrementally adjusting the frequency signal to adjust the current frequency to a target frequency for the second state; and
  incrementally adjusting the target frequency to the target frequency for the second state.

* * * * *